(12) United States Patent
Huang et al.

(10) Patent No.: US 11,764,779 B2
(45) Date of Patent: Sep. 19, 2023

(54) FOUR-TERMINAL-PAIR ALTERNATING CURRENT QUANTUM RESISTANCE DISSEMINATION BRIDGE AND RELATED METHOD

(71) Applicant: BEIJING ORIENT INSTITUTE OF MEASUREMENT AND TEST, Beijing (CN)

(72) Inventors: Xiaoding Huang, Beijing (CN); Yazhen Tong, Beijing (CN); Jianzhen Cai, Beijing (CN); Zhongwei Wang, Iinyi (CN); Pan Pan, Beijing (CN); Yi Sun, Beijing (CN); Shuqiang Wang, Beijing (CN); Jiaolan Yu, Beijing (CN); Qianjuan Wang, Beijing (CN); Jingjing Li, Ankang (CN); Xuwei Hou, Beijing (CN)

(73) Assignee: BEIJING ORIENT INSTITUTE OF MEASUREMENT AND TEST, Beijing (CN)

( * ) Notice: Subject to any disclaimer, the term of this patent is extended or adjusted under 35 U.S.C. 154(b) by 0 days.

(21) Appl. No.: 17/893,980

(22) Filed: Aug. 23, 2022

(65) Prior Publication Data
US 2023/0063872 A1 Mar. 2, 2023

(30) Foreign Application Priority Data

Aug. 25, 2021 (CN) .......................... 202110978409.0

(51) Int. Cl.
*G05F 1/46* (2006.01)
*H01C 1/16* (2006.01)
(Continued)

(52) U.S. Cl.
CPC ............... *H03K 17/92* (2013.01); *G05F 1/46* (2013.01); *H01C 1/16* (2013.01); *H01F 27/42* (2013.01); *H03H 11/28* (2013.01)

(58) Field of Classification Search
CPC .. H03K 17/92; G05F 1/46; H01C 1/16; H01F 27/42; H03H 11/28; G01R 17/105
See application file for complete search history.

(56) References Cited

FOREIGN PATENT DOCUMENTS

| CN | 101201368 A | 6/2008 |
|---|---|---|
| CN | 103529268 A | 1/2014 |

(Continued)

OTHER PUBLICATIONS

Schurr et al., "Unequalized Currents in Coaxial AC Bridges", IEEE Transactions on Instrumentation and Measurement, vol. 53, No. 3, Jun. 2004 (Year: 2004).*

(Continued)

*Primary Examiner* — Feba Pothen
(74) *Attorney, Agent, or Firm* — Zhigang Ma

(57) ABSTRACT

A four-terminal-pair AC quantum resistance dissemination bridge and related methods are provided. The bridge includes: a supply transformer IVD1, a Kelvin branch A1, a Wagner branch A0, the first and second current sources A2, A3, an injection inductive voltage divider A4, a ratio transformer IVD2, the first and second four-terminal AC resistor connection points Z1, Z2, chokes H, and null indicators D. An isolated inductive winding L0 is wound along the ratio transformer IVD2 and supplies excitation current to primary winding of injection inductive voltage divider A4 to avoid the mutual influence among various balance networks and rapid balance of the bridge can be realized. By changing turn ratio of primary winding L3 and secondary winding L4 of the second inductive voltage divider T2, the phase shift can be realized through only one set of capacitors for imaginary (Continued)

part error compensation, the bridge with multiple frequency points can be obtained.

11 Claims, 3 Drawing Sheets

(51) Int. Cl.
  *H01F 27/42* (2006.01)
  *H03H 11/28* (2006.01)
  *H03K 17/92* (2006.01)

(56) References Cited

FOREIGN PATENT DOCUMENTS

| | | |
|---|---|---|
| CN | 104374979 A | 2/2015 |
| CN | 105301320 A | 2/2016 |

OTHER PUBLICATIONS

Lei et al., "Quasi-Balance Four-Terminal Resistance Bridge", IEEE Transactions on Instrumentation and Measurement, vol. 64, No. 6, Jun. 2015 (Year: 2015).*

CNIPA, Notification of a First Office Action for CN202110978409.0, dated Sep. 27, 2021.

Beijing Orient Institute of Measurement and Test (Applicant), Reply to Notification of a First Office Action for CN202110978409.0, w/ replacement claims, Oct. 13, 2021.

Beijing Orient Institute of Measurement and Test (Applicant), Supplemental Reply to Notification of a First Office Action for CN202110978409.0, w/ replacement claims, Oct. 15, 2021.

Beijing Orient Institute of Measurement and Test (Applicant), Supplemental Reply to Notification of a First Office Action for CN202110978409.0, w/ replacement claims (allowed), Oct. 19, 2021.

CNIPA, Notification to grant patent right for invention in CN202110978409.0, Oct. 29, 2021.

B. Wood et al., Evaluation of the AC quantized Hall Resistance, Proceedings of 20th Biennial Conference on Precision Electromagnetic Measurements, Jun. 17, 1996, pp. 153-154.

Yang Yan et al., The new two terminal pair capacitance bridge at NIM, Acta Metrologica Sinica, Mar. 2020, pp. 284-289, vol. 41, No. 3.

Feng Jian et al., Precision Measurement of AC Resistance and Time Constant Based on Quasi-Balance Resistance Bridge, Transaction of China Electrotechnical Society, Oct. 2017, pp. 187-192, vol. 32, No. 19.

Xiaoding Huang et al., Research on AC Quantum Hall Resistance Standard and Application, Journal of Astronautic Metrology and Measurement, Jan. 2018, pp. 32-36, vol. 38, No. 1.

* cited by examiner

FOUR-TERMINAL-PAIR ALTERNATING CURRENT QUANTUM RESISTANCE DISSEMINATION BRIDGE AND RELATED METHOD

TECHNICAL FIELD

The invention relates to the technical field of alternating current (AC) resistance disseminations, in particularly to a four-terminal-pair AC quantum resistance dissemination bridge and a four-terminal-pair AC resistor measurement method.

BACKGROUND

Resistance has frequency characteristics, and the traceability of AC resistance is an international problem. Based on the AC Quantum Hall Effect, an international frontier measurement technology, basic physical constants are used to define the impedance unit quantity value, which has the characteristic of not changing with the change of time and space, can realize the unification of the unit definition of AC resistance, capacitance, inductance and direct current (DC) resistance, and can solve the current problem of AC resistance traceability. The key technology is to disseminate an AC resistance quantity value reproduced by the AC Quantum Hall Effect to a physical AC standard resistor with a very small uncertainty. Thus it is necessary to develop a high-accuracy impedance bridge of $10^{-8}$ order of magnitude and realize the dissemination of astatic impedance.

Since the four-terminal pair definition of AC impedance is the most perfect form and the AC quantum Hall resistor sample is a four-terminal-pair structure, the AC resistance of $10^{-8}$ order of magnitude also needs to use the four-terminal-pair structure. The technical index of the AC quantum Hall resistance standard is to reproduce the AC impedance quantity value at the order of $10^{-8}$. Therefore, the dissemination uncertainty of the high-accuracy AC impedance bridge as a quantity value dissemination bridge should also reach the order of $10^{-8}$, which is 4 to 5 orders of magnitude higher than that of the current common impedance bridge or RLC of $10^{-4}$ order of magnitude, which is extremely difficult to achieve. In order to establish a Quantum Impedance Standard based on the AC Quantum Hall Effect and realize the traceability from the AC quantum Hall resistance standard to the physical AC resistance, a four-terminal-pair AC impedance bridge should be employed. The four-terminal-pair AC impedance bridge conforms to the definition of AC impedance, has the ability to eliminate various interferences by use of a variety of technical means, and can realize the dissemination of astatic impedance of $10^{-8}$ order of magnitude. However, its structure is very complicated and the process of balancing is tedious, where there is a problem of mutual influence existed between the multiple balances, resulting in the balance convergence is very slow and the frequency point is single.

Specifically, the four-terminal-pair AC impedance bridge is a transformer bridge with a very accurate proportional value. Its basic principle is to measure an AC impedance according to the definition of the four-terminal-pair impedance, which means no current flows in a voltage loop and currents of core and sheath in a current loop are equal in magnitude and opposite in direction. A principle diagram is shown in FIG. 1. In order to eliminate the lead error, an error potential compensation method is used. Null indicators are connected to potential leads and adjustable compensation power supplies are connected to current leads, referring to three pairs of combinations D1-S1, D2-S2 and D3-S3 of null indicators and adjustable compensation power supplies in FIG. 1. When the adjustable compensation power supplies S1, S2 and S3 are adjusted to make the null indicators at the potential leads point to zero, the lead error is compensated, and the problem of current leakage can be avoided. By adjusting the S4 to make the D4 point to zero while the null indicators in the three balance networks S1-D1, S2-D2 and S3-D3 also pointing to zero, the balance-adjustment of the bridge is basically completed. During the adjustment of balance, the injection inductive voltage divider A4 is adjusted to achieve error balance, leading to the load of power supply of the bridge change. Then the balanced Wagner branch A0 will be broken, so that a fifth null indicator D5 connected to a proportional balance point V0 of a winding of a ratio transformer IVD2 no longer points to zero, which means each the balance network also is broken and a further adjustment is needed to make the third null indicator D3, the second null indicator D2 and the fifth null indicator D5 point to zero again, and then the injection inductive voltage divider A4 is adjusted again to achieve error balance. However after completing one cycle of adjustment, the balance of the Wagner branch would be broken again. The larger the changed value of the load of power supply caused by the adjustment of the injection inductive voltage divider A4, the more the number of times of cyclic adjustment for pointing to zero is required, and the more difficult it is to achieve the balance of the bridge. That is to say, every time one adjustable current source is adjusted to make the null indicator of the corresponding balance network point to zero, it will affect the other three balance networks and thus it needs to repeat the cyclic adjustment for many times, and moreover, in the process of adjustment, the balance networks cannot converge at the same time, so that it is very difficult to adjust.

In a specific implementation of the four-terminal-pair AC impedance bridge, a circuit structure is shown in FIG. 2, which is very complex and includes: the supply transformer IVD1, the Kelvin branch A1, the Wagner branch A0, the first current source A2, the second current source A3, the injection inductive voltage divider A4, the ratio transformer IVD2, the first four-terminal-pair AC resistor connection point Z1, the second four-terminal-pair AC resistor connection point Z2, chokes H, and several null indicators D.

The Kelvin branch A1 is connected to the connection lead between the Z1 and the Z2 in a manner of Kelvin connection. The inductive voltage supply winding B0 is connected to a signal generator DDF1 to supply power to the Kelvin branch A1 or is connected to an additional signal source to supply power to the Kelvin branch A1 to thereby form the first adjustable current source S1. The S1 and a null indicator D1 connected to the Kelvin branch A1 together form a first balance network S1-D1, to eliminate the lead error of a lead between the Z1 and the Z2.

The signal generator DDF1 and a phase-locked amplifier DDF2 are connected to the supply transformer IVD1 to thereby together form a power supply S of the bridge circuit to supply power to the whole bridge circuit. The phase-locked amplifier DDF2 can also be used as a null indicator D in the bridge circuit. A secondary winding of the supply transformer IVD1 has the first output terminal V11, the second output terminal V12, the third output terminal V13 and the fourth output terminal V14 in sequence from its high-voltage end (i.e., the upper end in FIG. 2) to its low-voltage end (i.e., the lower end in FIG. 2). The second output terminal V12 and the third output terminal V13 supply power to the ratio transformer IVD2 and the Wagner branch A0 of the bridge. Input terminals of the first current source A2 are connected with the first output terminal V11 and the second output terminal V12 to form a second adjustable current source S2. The pair of terminals at a same side of the first four-terminal-pair AC resistance connection point Z1 are respectively connected to an output terminal of the first current source A1 and the high-voltage end of the IVD2, a second null-indicating inductive winding B2 for inducing a lead current between the first four-terminal-pair AC resistor connection point Z1 and the high-voltage end of the ratio transformer IVD2 is connected to the null indicator D2, and thereby a second balance network S2-D2 (i.e., high voltage proportional branch of the bridge) is formed. Input terminals of the second current source A3 are respectively connected to the third output terminal V13 and the fourth output terminal to form a third adjustable current source S3. The pair of terminals at a same side of the second four-terminal-pair AC resistor connection point Z2 are respectively connected to an output terminal of the second current source A3 and the low-voltage end of the IVD2. The third null-indicating inductive winding B3 for inducing a lead current between the Z2 and the lower-voltage end of the IVD2 is connected to a null indicator D3, and thereby a third balance network S3-D3 (i.e., low-voltage proportional branch of the bridge) is formed. Voltages supplied from the S to the first current source A2 and the second current source A3 respectively are equal in amplitude and opposite in polarity. A compensation voltage outputted by the injection inductive voltage divider A4 is compensated onto the lead between the Z2 and the low-voltage end of the IVD2. In the whole bridge circuit, a voltage ratio of the bridge arm where the Z1 is located and the bridge arm where the Z2 is located is equal to a resistance ratio. When the bridge is balanced, a resistance of the first four-terminal AC resistor connected to the Z1 is equal to the sum of a resistance of the second four-terminal AC resistor connected to the Z2 and a resistance corresponding to the compensation voltage output by the injection inductive voltage divider A4 to the bridge circuit.

In the bridge circuit, in order to realize the dissemination of $10^{-8}$ order of magnitude of the four-terminal-pair impedance bridge, the Wagner branch A0 is used for shielding protection to eliminate the current leakage on the proportional balance point V0 of the main proportional arm of the ratio transformer IVD2. Meanwhile, the injection inductive voltage divider A4 is used to realize the final balance of the four-terminal-pair AC resistance dissemination bridge. At present, the injection inductive voltage divider A4 of the four-terminal-pair AC impedance bridge is directly powered by the supply transformer IVD1 of the bridge and is connected with the Wagner branch A0 in parallel. During performing error adjustment, the previously balanced Wagner branch is broken due to the change of the load, also after the error adjustment to achieve balance, the adjustment of the Wagner assisted balance would seriously affect the error balance. That is to say, the mutual influence between the Wagner assisted balance and the error balance is particularly prominent, which makes the convergence of the balance of the bridge slower.

In addition, the balance of the four-terminal-pair AC resistance dissemination bridge requires both real part balance and imaginary part balance. An imaginary part compensation voltage is usually obtained through one group of voltage-dividing capacitors and one group of output resistors. However, the impedance value $1/j\omega c$ generated by the capacitors will change with the change of frequency. In order to achieve multiple frequency points, multiple groups of voltage-dividing capacitors are needed, which makes the structure and the switching of the four-terminal-pair AC impedance bridge complicated.

SUMMARY

The invention provides a four-terminal-pair AC quantum resistance dissemination bridge and a four-terminal-pair AC resistor measurement method. An isolated inductive winding for supplying an excitation current to a primary winding of an injection inductive voltage divider is wound on a winding of a ratio transformer. The number of turns of the isolated inductive winding is small and may be only one turn, so that mutual influence among various balance networks caused by a direct connection of the primary wining of the injection inductive voltage divider with a supply transformer can be avoided. On the basis of realizing high-accuracy four-terminal-pair AC resistance dissemination with $10^{-8}$ order of magnitude, the mutual interference between a Wagner branch for assisting balance and the injection inductive voltage divider can be greatly reduced, thereby the bridge balance can be quickly converged.

In order to achieve the purpose of the invention, the invention provides technical solutions as follows.

A four-terminal-pair AC quantum resistance dissemination bridge, in which an isolated inductive winding L0 of a small number of turns (e.g., less than five turns) is wound on a winding of the ratio transformer IVD2. The isolated inductive winding L0 is configured (i.e., structured and arranged) to supply an excitation current to a primary winding of the injection inductive voltage divider A4 to avoid mutual influence of various branches caused by a direct connection of the primary winding of the injection inductive voltage divider A4 with a supply transformer IVD1. As a result, the bridge with rapid balance can be realized.

In a preferred embodiment, an outer circumferential surface of the winding of the ratio transformer IVD2 is independently wound with the isolated inductive winding L0 of one turn.

In a preferred embodiment, the four-terminal-pair AC quantum resistance dissemination bridge includes: a supply transformer IVD1, a Kelvin branch A1, a Wagner branch A0, a first current source A2, a second current source A3, the injection inductive voltage divider A4, the ratio transformer IVD2, a first four-terminal-pair AC resistor connection point Z1, a second four-terminal-pair AC resistor connection point Z2, chokes H, and multiple null indicators D. The Kelvin branch A1 is configured to proportionally distribute lead resistances between the first four-terminal-pair AC resistor connection point Z1 and the second four-terminal-pair AC resistor connection point Z2 to thereby eliminate a lead error. The ratio transformer IVD2 and the Wagner branch A0 are connected in parallel between two ends of the supply transformer IVD1. The Wagner branch A0 is configured to eliminate current leakage on a proportional balance point V0 of the main proportional arm. The injection inductive voltage divider A4 is configured to be supplied with the excitation current through the isolated inductive winding L0 and compensate the compensation voltage into the bridge circuit.

In a preferred embodiment, the injection inductive voltage divider A4 includes the first inductive voltage divider T1 and the second inductive voltage divider T2, the secondary winding L2 of the first inductive voltage divider T1 together with a set of voltage-dividing resistors R are configured to realize adjustment of real part balance of the bridge. The secondary winding L4 of the second inductive voltage divider T2 together with a set of voltage-dividing capacitors C are configured to realize adjustment of imaginary part balance of the bridge. The primary winding L3 of the second inductive voltage divider T2 are provided with taps from a high-voltage end to a low-voltage end as per a certain turn change. The a turn ratio of the primary winding L3 to the secondary win L4 of the second inductive voltage divider T2 is adjustable to make an induction ratio change of the second inductive voltage divider T2 to offset an impedance change of the voltage-dividing capacitors caused by a change of a frequency. Therefore, the impedances of the voltage-dividing capacitors C do not change with the change of the frequency.

In a preferred embodiment, a primary winding L1 of the first inductive voltage divider T1, the secondary winding L2 of the first inductive voltage divider T1 and the secondary winding L4 of the second inductive voltage divider T2 all have the same number of turns, namely 70 turns; the primary winding L3 of the second inductive voltage divider T2 is connected to the tap with a number of turns being 44 turns when the frequency is 1 kHz, the primary winding L3 of the second inductive voltage divider T2 is connected to the tap with a number of turns being 70 turns when the frequency is 1.592 kHz, the primary winding L3 of the second inductive voltage divider T2 is connected to the tap with a number of turns being 88 turns when the frequency is 2 kHz, the primary winding L3 of the second inductive voltage divider T2 is connected to the tap with a number of turns being 140 turns when the frequency is 3.184 kHz, the primary winding L3 of the second inductive voltage divider T2 is connected to the tap with a number of turns being 220 turns when the frequency is 5 kHz, thereby ensuring the impedance of the voltage-dividing capacitors C does not change with the change of the frequency.

In a preferred embodiment, the supply transformer IVD1 is disposed with a signal generator DDF1 and a phase-locked amplifier DDF2; the primary winding of the supply transformer IVD1 is connected to the signal generator DDF1 and the phase-locked amplifier DDF2 through a power amplifier; the secondary winding of the supply transformer IVD1 has a first output terminal V11, a second output terminal V12, a third output terminal V13 and a fourth output terminal V14 from its high-voltage end to its low-voltage end sequentially; the second output terminal V12 and the third output terminal V13 are configured to supply power to the ratio transformer IVD2 and the Wagner branch A0 of the bridge; the number of coil turns between the first output terminal V11 and the second output terminal V12 is equal to a number of coil turns between the third output terminal V13 and the fourth input terminal V14; the first output terminal V11 and the second output terminal V12 are configured to supply power to a high voltage proportional branch of the bridge where the first current source A2 is located; the third output terminal V13 and the fourth output terminal V14 are configured to supply power to a low voltage proportional branch of the bridge where the second current source A3 is located, and the polarity of a potential supplied to the high voltage proportional branch of the bridge is opposite to the polarity of a potential supplied to the low voltage proportional branch of the bridge.

In a preferred embodiment, chokes H are sleeved on leads in a measurement circuit to ensure that currents of core and sheath of each coaxial line of astatic construction are equal in magnitude and opposite in direction.

A four-terminal-pair AC resistor measurement method, using the above described four-terminal-pair AC quantum resistance dissemination bridge to measure a to-be-measured four-terminal-pair AC resistor Rx, includes:

Step 1, select a standard four-terminal-pair AC resistor Rs according to measurement requirements after obtaining the nominal value of the to-be-measured four-terminal-pair AC resistor Rx, connect the to-be-measured four-terminal-pair AC resistor Rx and the standard four-terminal-pair AC resistor Rs to the first four-terminal-pair AC resistor connection point Z1 and the second four-terminal-pair AC resistor connection point Z2 respectively, and obtain the proportional balance point V0 of a secondary winding of the ratio transformer IVD2 corresponding to a turn ratio of winding of the ratio transformer IVD2 according to a ratio between the nominal value of the to-be-measured four-terminal-pair AC resistor Rx and the nominal value of the standard four-terminal-pair AC resistor Rs;

Step 2, adjust the Wagner branch A0 to make a potential on the proportional balance point V0 of the ratio transformer IVD2 be a ground potential and make a fifth null indicator D5 connected with the proportional balance point V0 point to zero to solve current leakage on the proportional balance point V0 of the secondary winding of the ratio transformer IVD2 of the bridge;

Step 3, adjust the first current source A2 to make the second null indicator D2 connected between a high-voltage end of the ratio transformer IVD2 and the first four-terminal-pair AC resistor connection point Z1 point to zero and thereby solve a problem of current existing in a high voltage proportional branch of the bridge;

Step 4, adjust the second current source A3 to make a third null indicator D3 connected between a low-voltage end of the ratio transformer IVD2 and the second four-terminal-pair AC resistor connection point Z2 point to zero and thereby solve a problem of current existing in a low voltage proportional branch of the bridge;

Step 5, adjust the injection inductive voltage divider A4 to make a first null indicator D1 connected with the Kelvin branch A1 point to zero;

Step 6, supply power to the Kelvin branch A1 through the inductive voltage supply winding B0 and adjust Kelvin branch A1 to make the first null indicator D1 connected with the Kelven branch A1 point to zero again and thereby solve a problem of equal-proportional distribution of lead resistances between the first four-terminal-pair AC resistor connection point Z1 and the second four-terminal-pair AC resistor connection point Z2.

Step 7, disable the inductive voltage supply winding B0 to supply power to the Kelvin branch A1, and adjust the injection inductive voltage divider A4 again to make the first null indicator D1 point to zero again, verifying that the second zero pointer D2, the third zero pointer D3 and the fifth zero pointer D5 all point to zero, and then read values of real part and imaginary part of the injection inductive voltage divider A4 to thereby obtain a real part difference and an imaginary part difference between the to-be-measured four-terminal-pair AC resistor Rx and the standard four-terminal-pair AC resistor Rs and figure out a real part quantity value and an imaginary part quantity value of the to-be-measured AC resistor Rx.

In a preferred embodiment, when the nominal value or estimated value of the to-be-measured four-terminal-pair AC resistor Rx is 10 times or more of that of the standard four-terminal-pair AC resistor Rs (also referred to reference four-terminal-pair AC resistor Rs), the to-be-measured four-terminal-pair AC resistor Rx is connected to the first four-terminal-pair AC resistor connection point Z1 and the standard four-terminal-pair AC resistor Rs is connected to the second four-terminal-pair AC resistor connection point Z2. The injection inductive voltage divider A4 is supplied with an excitation current through the isolated inductive winding L0 and compensates a compensation voltage into a bridge arm where the standard four-terminal-pair AC resistor Rs is located.

In a preferred embodiment, when the difference between the nominal value or estimated value of the to-be-measured four-terminal-pair AC resistor Rx and that of the standard four-terminal-pair AC resistor Rs is less than 10 times, any one of the to-be-measured four-terminal-pair AC resistor Rx and the standard four-terminal-pair AC resistor Rs is selected to be connected to the first four-terminal-pair AC resistor connection point Z1.

In a preferred embodiment, in the step 7, after adjusting the injection inductive voltage divider A4 again to make the first null indicator D1 point to zero again, check the second null indicator D2, the third null indicator D3 and the fifth null indicator D5 whether point to zero individually, and repeat the steps 2-7 for 1-2 times when any one of the second null indicator D2, the third null indicator D3 and the fifth null indicator D5 does not point to zero to thereby make the second null indicator D2, the third null indicator D3 and the fifth null indicator D5 all point to zero.

Compared with prior art, the invention may have advantages as follows.

1. As to the four-terminal-pair AC quantum resistance dissemination bridge and the four-terminal-pair AC resistor measurement method of the invention, the isolated inductive winding L0 with a small number of turns is independently and additionally wound on the winding of the ratio transformer IVD2 to supply power to the injection inductive voltage divider. Because the isolated inductive winding L0 independently induces a voltage from the winding of the ratio transformer IVD2 in an induction mode and the number of coil turns of the isolated inductive windings L0 is very small, preferably one turn, the injection inductive voltage divider A4 as a whole adds almost negligible load to the supply transformer IVD1 of the bridge. When the set of voltage-dividing resistors R and the set of voltage-dividing capacitors C participating in the measurement in the injection inductive voltage divider A4 are adjusted, what is reflected on the supply transformer IVD1 of the bridge is equivalent to a constant load. Therefore the balanced Wagner branch is not greatly affected or even not affected and the mutual interference between the injection inductive voltage divider A4 and other balance-assisting networks can be reduced, and the balance of the bridge can be quickly converged.

2. As to the four-terminal-pair AC quantum resistance dissemination bridge and the four-terminal-pair AC resistor measurement method of the invention, by mean of changing the turn ratio of the primary winding L3 and the secondary winding L4 of the second inductive voltage divider T2, the phase shift of multiple frequency points can be realized through only one set of capacitors for imaginary part error compensation. The error adjustment of imaginary part can be realized and the four-terminal-pair AC quantum resistance dissemination bridge with multiple frequency points based on one set of voltage-dividing capacitors C can be obtained.

DESCRIPTION OF NUMERAL REFERENCES IS AS FOLLOWS

S1, the first adjustable current source (first adjustable compensation power supply); S2, the second adjustable current source; S3, the third adjustable current source; D1, the first null indicator; D2, the second null indicator; D3, the third null indicator; D4, the fourth null indicator; D5, the fifth null indicator; S1-D1, the first balance network; S2-D2, the second balance network; S3-D3, the third balance network; IVD1, the supply transformer; V11, the first output terminal; V12, the second output terminal; V13, the third output terminal; V14, the fourth output terminal; IVD2, the ratio transformer; V0, proportional balance point; L0, isolated inductive winding; A1, Kelvin branch; A2, first current source; A3, second current source; A4, injection inductive voltage divider; A0, Wagner branch; B0, inductive voltage supply winding; B1, first null-indicating inductive winding; B2, second null-indicating inductive winding; B3, third null-indicating inductive winding; B4, compensation winding; Z1, the first four-terminal-pair AC resistor connection point; Z2, the second four-terminal-pair AC resistor connection point; DDF1, signal generator; DDF2, phase-locked amplifier; R, voltage-dividing resistors; R1, the first voltage-dividing resistor; R2, the second voltage-dividing resistor; R3, the third voltage-dividing resistor; R4, the fourth voltage-dividing resistor; R5, the fifth voltage-dividing resistor; R6, resistor; C, voltage-dividing capacitors; C1, the first voltage-dividing capacitor; C2, the second voltage-dividing capacitor; C3, the third voltage-dividing capacitor; C4, the fourth voltage-dividing capacitor; C5, the fifth voltage-dividing capacitor; T1, the first inductive voltage divider; T2, the second inductive voltage divider; T3, error injection winding; L1, the primary winding of the first inductive voltage divider; L2, the second winding of the first inductive voltage divider; L3, the primary winding of the second inductive voltage divider; L4, the secondary winding of the second inductive voltage divider; H, choke; Rx, to-be-measured four-terminal-pair AC resistor; and Rs, standard four-terminal-pair AC resistor.

DETAILED DESCRIPTION OF EMBODIMENTS

In order to facilitate understanding of the invention, the invention will be described in more detail below in combination with specific embodiments.

Embodiment 1

Figure 3:
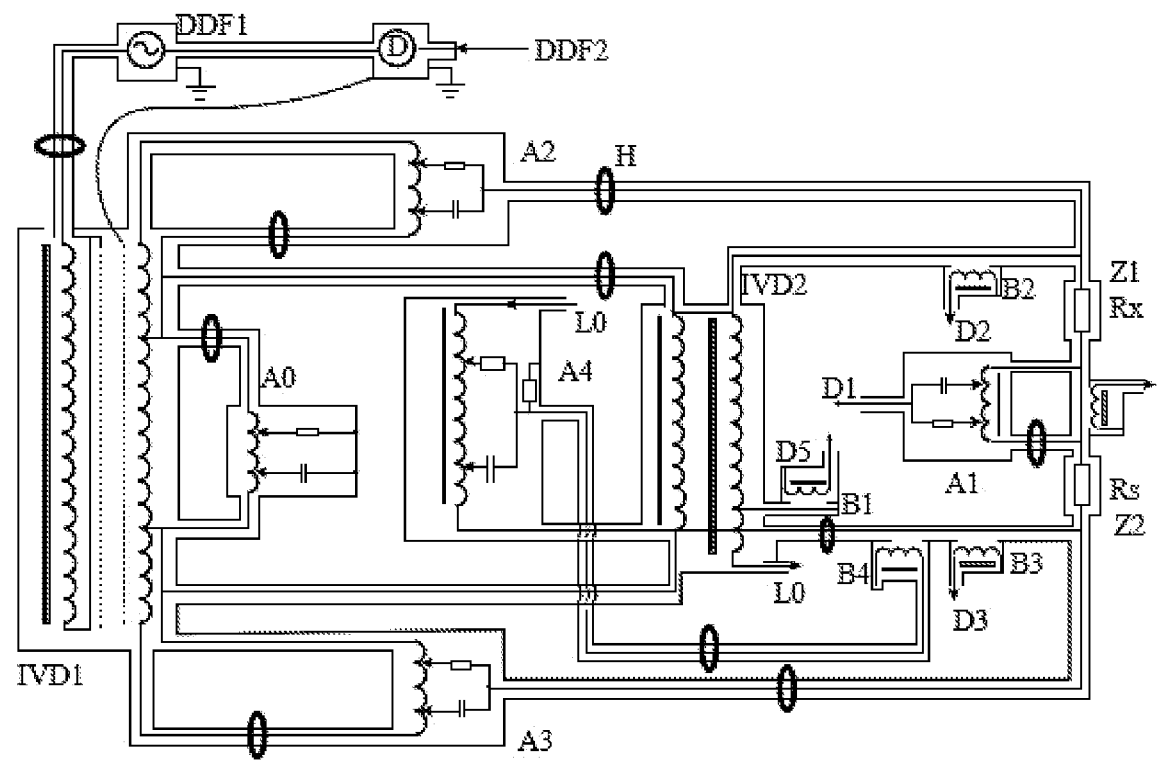
FIG. 3 is a schematic circuit diagram of a four-terminal-pair AC quantum resistance dissemination bridge according to an embodiment of the invention.

As illustrated in FIG. 3, a schematic circuit diagram of a four-terminal-pair alternating current (AC) quantum resistance dissemination bridge is shown. Specifically, the fourterminal-pair AC quantum resistance dissemination bridge includes: a supply transformer IVD1, the injection inductive voltage divider A4, the ratio transformer IVD2, the Wagner branch A0, the first four-terminal-pair AC resistor connection point Z1, the second four-terminal-pair AC resistor connection point Z2, chokes H, and null indicators D. The first four-terminal-pair AC resistor connection point Z1 is connected with a standard four-terminal-pair AC resistor Rs (also referred to as reference four-terminal-pair AC resistor Rs), and the standard four-terminal-pair AC resistor Rs is preferably a four-terminal-pair quantum Hall resistor, or is a calibrated standard resistor that can reach $10^{-8}$ or other higher uncertainty level instead. The second four-terminal-pair AC resistor connection point Z2 is connected with a to-be-measured four-terminal-pair AC resistor Rx.

It is given that a ratio of the nominal resistance of the standard four-terminal-pair AC resistor Rs to a nominal resistance of the to-be-measured four-terminal-pair AC resistor Rx is 10:1, and the number of coil turns of winding of the IVD2 is 110.

The number of coil turns between the first output terminal V11 and the second output terminal V12 of the IVD1 is equal to the number of coil turns between the third output terminal V13 and the fourth output terminal V14 of the IVD1, and both are 10 turns. The number of coil turns between the second output terminal V12 and the third output terminal V13 is 100 turns. After a signal generator DDF1 and a phase-locked amplifier DDF2 are injected into the IVD1, the potential on the first output terminal V11 is 11V, the potential on the second output terminal V12 is 10V, the potential on the third output terminal V13 is −1V, and the potential on the fourth output terminal V14 is −2V.

Figure 1:
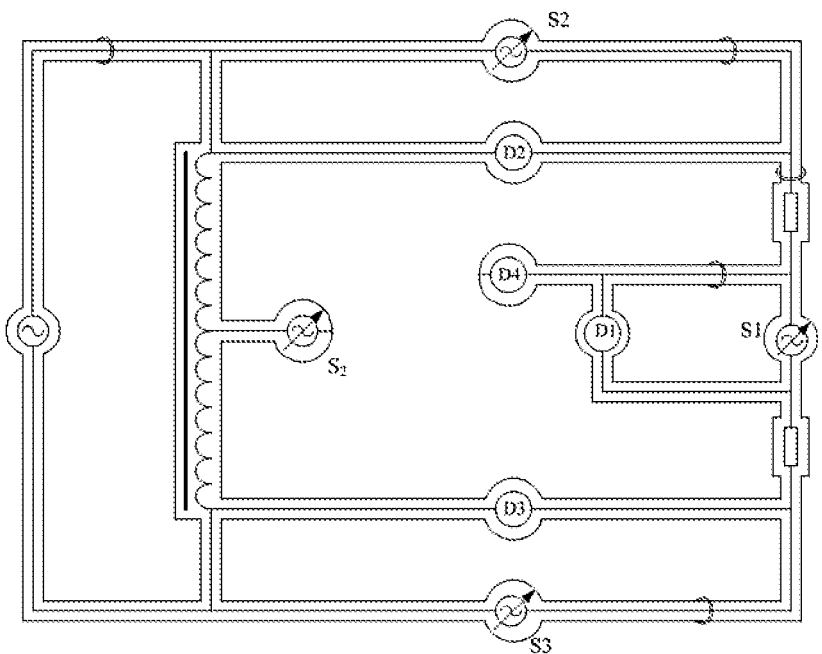
FIG. 1 is a schematic diagram of a four-terminal-pair (4TP) alternating current (AC) impedance dissemination bridge.

The ratio transformer IVD2 is a self-coupling type inductive voltage divider, a high-voltage end potential thereof is equal to the potential of 10V on the second output terminal V12, and a low-voltage end potential thereof is equal to the potential of −1V on the third output terminal V13. Since the load of power supply of the winding is squared with the number of turns of the main proportional arm, the turn ratio of winding of the IVD2 should be 10:1 to balance the main proportional arm of the bridge initially, which means the proportional balance point V0 of the IVD2 should be at a tap position distant from the high-voltage end with 100 turns. The proportional balance point V0 is connected to a fifth null indicator D5 through the first null-indicating inductive winding B1. Because the main proportional arm has leakage, the fifth null indicator D5 connected to the proportional balance point V0 does not point to zero before balance-adjustment during measurement, and herein the fifth null indicator D5 is made to point to zero by adjusting the Wagner branch A0 connected with the IVD2 in parallel, that is, a potential on the proportional balance point V0 is a ground potential to realize a balance assisted by the Wagner branch, and thereby ensure that no leakage current flows through the main proportional arm, i.e., to eliminate the influence of leakage. The fifth null indicator D5, a first null indicator D1, a second null indicator D2 and a third null indicator D3, during balance-adjustment of the bridge, are preferably connected (switchable connection) to null indicators D in FIG. 2 and FIG. 3; or, during the balance-adjustment of the bridge, the fifth null indicator D5 is independently connected to one null indicator while the first null indicator D1, the second null indicator D2 and the third null indicator D3 are switchable to share the null indicators D in FIG. 2 and FIG. 3. Moreover, in an illustrated embodiment, the first null indicator D1 is equivalent to D1 and D4 in FIG. 1.

Figure 4:
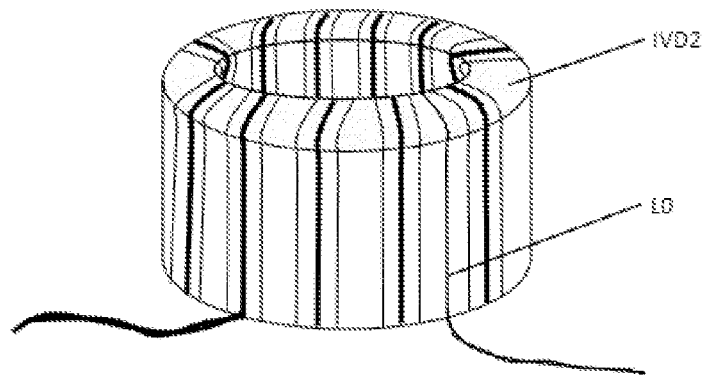
FIG. 4 is a schematic structural diagram of a ratio transformer of the four-terminal-pair AC quantum resistance dissemination bridge according to an embodiment of the invention.

In a four-terminal-pair bridge, an astatic construction needs to ensure that currents of core and sheath of each coaxial line are equal in magnitude and opposite in direction, and a currently employed solution is to use a choke H or an active choke H to ensure the astatic construction of a measurement line. As illustrated in FIG. 4, one turn of isolated inductive winding L0 is wound on the winding of the ratio transformer IVD2, a voltage that can be induced by the one turn of isolated inductive winding L0 is 0.1V, that is, an excitation current of a primary winding of the injection inductive voltage divider A4 is obtained from the isolated inductive winding L0, because the excitation current is induced by the isolated inductive winding, it has little impact on the IVD2 itself, after reflecting onto the Wagner branch A0 and the supply transformer IVD1, since the load of power supply is squared with the number of turns, i.e., a load of an error compensation inductive voltage supply winding B4 in the main proportional arm of the bridge is one percent, a load of the injection inductive voltage divider A4 for the power supply of the bridge correspondingly is one percent of its original, it can be basically ignored and will not even cause a change of balance of the Wagner branch, even if it can cause mutual interference between the balance of the Wagner branch and the error balance, the balance of the bridge can be achieved quickly through several times of adjustment, so that the balance of the bridge can converge quickly, which can greatly reduce balance-adjustment time and workload of the bridge.

Figure 2:
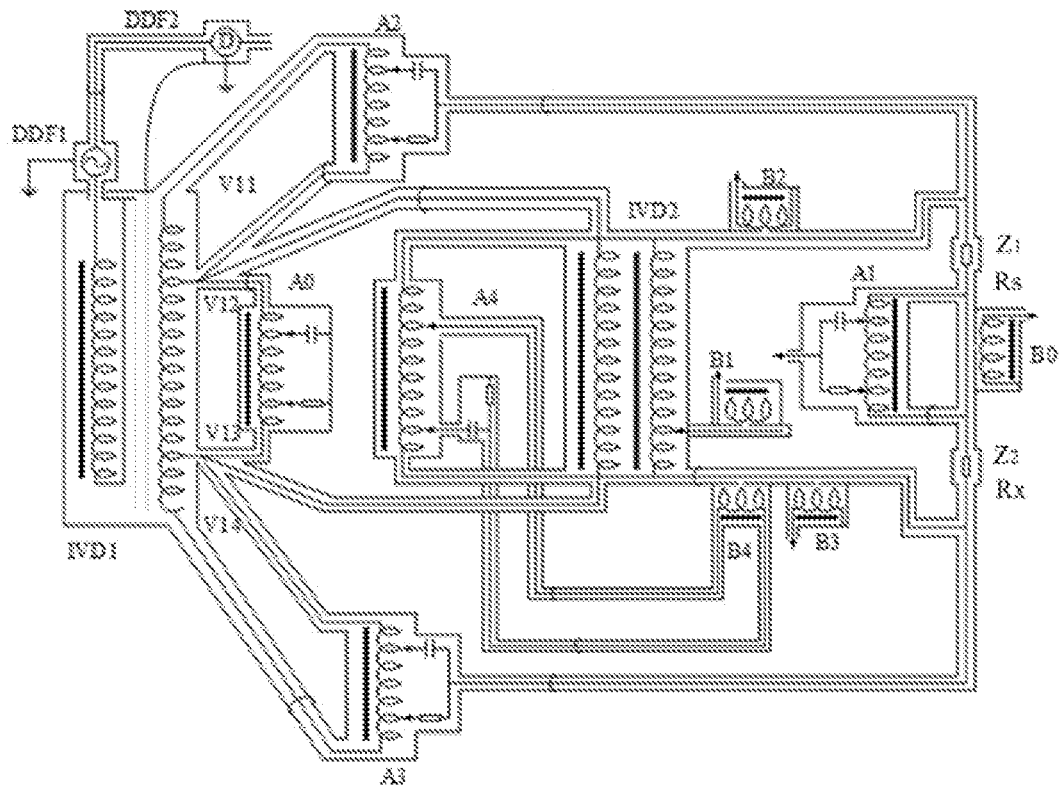
FIG. 2 is a schematic circuit diagram of a four-terminal-pair AC resistance dissemination bridge that is not easily balanced.

As shown in FIG. 2, the high-voltage end and the low-voltage end of IVD2, the Wagner branch A0 and the injection inductive voltage divider A4 are connected in parallel between the second output terminal V12 and the third output terminal V13. The supply voltage of the injection inductive voltage divider A4 is 10 V, and its overall power load will result in a direct influence on the Wagner branch A0, and the impact on the balance of the Wagner branch A0 is at least 100 times of the above illustrated embodiment of the invention, for balance networks with different convergence performances, a time length of adjusting the balance of bridge caused by such influence is at least 1-2 days or even one week for the scheme of FIG. 2, while the illustrated scheme of the invention takes only a few minutes. As a result, the work intensity of measurement personnel is greatly reduced, and lengthy and tedious measurement process is also alleviated.

Embodiment 2

A four-terminal-pair AC resistor measurement method, using the above four-terminal-pair AC quantum resistance dissemination bridge to measure a to-be-measured four-terminal-pair AC resistor Rx, includes step 1 through step 7 as follows.

In the step 1, the nominal value of the to-be-measured four-terminal-pair AC resistance Rx as estimated or acquired is 100Ω; and a Quantum Hall Resistor is selected as the standard four-terminal-pair AC resistor Rs according to measurement requirements, and the standard four-terminal-pair AC resistor Rs preferably is 1 KΩ and its uncertainty level is $10^{-8}$. The to-be-measured four-terminal-pair AC resistor Rx is connected to the second four-terminal-pair AC resistor connection point Z2, and the standard four-terminal-pair AC resistor Rs is connected to the first four-terminal-pair AC resistor connection point Z1. According to the ratio between the nominal value of the to-be-measured four-terminal-pair AC resistor Rx and the nominal value of the standard four-terminal-pair AC resistor Rs, corresponding to the turn ratio 10:1 of winding of the ratio transformer IVD2, the proportional balance point V0 of the IVD2 is found at a tap position distant from the high-voltage end of the IVD2 with 100 turns.

In the step 2, the Wagner branch A0 is adjusted to make the potential on the proportional balance point V0 of the ratio transformer IVD2 is a ground potential, that is, to make the fifth null indicator D5 connected with the balance point V0 point to zero, thereby solving the current leakage of the main proportional arm of the bridge.

In the step 3, the first current source A2 is adjusted to make the second null indicator D2 connected between the high-voltage end of the ratio transformer IVD2 and the first four-terminal-pair AC resistor connection point Z1 point to zero, thereby solving the problem of current existing in a high voltage proportional branch of the bridge.

In the step 4, the second current source A3 is adjusted to make the third null indicator D3 connected between the low-voltage end of the ratio transformer IVD2 and the second four-terminal-pair AC resistor connection point Z2 point to zero, thereby solving the problem of current existing in a low voltage proportional branch of the bridge.

In the step 5, the injection inductive voltage divider A4 is adjusted to make the first null indicator D1 (equivalent to D4 in FIG. 1 at this time) connected with the Kelvin branch A1 point to zero.

In the step 6, the Kelvin branch A1 is supplied with power through the inductive voltage supply winding B0, and the Kelvin branch A1 is adjusted to make the first null indicator D1 (equivalent to D1 in FIG. 1 at this time) connected thereto point to zero, so that lead resistances between the to-be-measured four-terminal-pair AC resistance Rx and the standard four-terminal-pair AC resistor Rs are distributed proportionally, thereby eliminating an error caused by a lead connecting the to-be-measured four-terminal pair AC resistor Rx with the standard four-terminal pair AC resistor Rs, and solving the problem of equal-proportional distribution of lead resistances between the first four-terminal pair AC resistor connection point Z1 and the second four-terminal pair AC resistor connection point Z2. The inductive voltage supply winding B0 preferably is an isolated inductive winding of one turn or several turns additionally provided on the ratio transformer IVD2; or, the Kelvin branch A1 is supplied with power by adding an additional signal source to the inductive voltage supply winding B0.

In the step 7, the inductive voltage supply winding B0 is disabled to supply power to the Kelvin branch A1, and the injection inductive voltage divider A4 is adjusted again to make the first null indicator D1 (equivalent to D4 in FIG. 1 at this time) point to zero again. The standard four-terminal-pair AC resistor Rs is an impedance unit quantity value defined by a basic physical constant based on the AC Quantum Hall Effect, and its uncertainty currently can reach $10^{-8}$, and thus it is necessary to adjust the injection inductive voltage divider A4 finally to make the first null indicator D1 (equivalent to D4 in FIG. 1) point to zero again. By adjusting the number and positions of a set of voltage-dividing resistors and a set of voltage-dividing capacitors in the injection inductive voltage divider A4 connected in the bridge circuit, a real part voltage value and an imaginary part voltage value of the injection inductive voltage divider A4 can be obtained, and thereby a real part difference as well as an imaginary part difference between the to-be-measured four-terminal-pair AC resistor Rx and the standard four-terminal-pair AC resistor Rs are obtained, so that the uncertainty level of $10^{-8}$ order of magnitude of the standard four-terminal-pair AC resistor Rs is completely disseminated to the to-be-measured four-terminal-pair AC resistor Rx through the bridge.

As another embodiment, the nominal value of the to-be-measured four-terminal-pair AC resistor Rx is 1 KΩ, the standard four-terminal-pair AC resistor Rs is 100Ω, the to-be-measured four-terminal-pair AC resistor Rx is connected to the first four-terminal-pair AC resistor connection point Z1, and the standard four-terminal-pair AC resistor Rs is connected to the second four-terminal-pair AC resistor connection point Z2. The injection inductive voltage divider A4 is supplied with an excitation current through the isolated inductive winding L0 and compensates a compensation voltage to a bridge arm where the standard four-terminal-pair AC resistor Rs is located. An internal structure of the injection inductive voltage divider A4 is shown in FIG. 5, and will be described in detail in the next embodiment.

Preferably, in the step 7, after the injection inductive voltage divider A4 is adjusted again to make the first null indicator D1 point to zero again, it may perform an operation of checking whether the second null indicator D2, the third null indicator D3 and the fifth null indicator D5 all point to zero. When it is not chosen to check whether the second null indicator D2, the third null indicator D3 and the fifth null indicator D5 all point to zero, it is defaulted that the second null indicator D2, the third null indicator D3 and the fifth null indicator D5 all point to zero. When it is chosen to check whether the second null indicator D2, the third null indicator D3 and the fifth null indicator D5 all point to zero, if the second null indicator D2, the third null indicator D3 and the fifth null indicator D5 all point to zero, a real part difference as well as an imaginary part difference between the to-be-measured four-terminal-part AC resistor Rx and the standard four-terminal-pair AC resistor Rs can be obtained through one cycle of zero-adjustment (5 times of zero-adjustment), so as to derive the real part quantity value and an imaginary part quantity value of the to-be-measured four-terminal-pair AC resistor Rx. If any one of the second null indicator D2, the third null indicator D3 and the fifth null indicator D5 does not point to zero, the step 2 through the step 7 are repeated 1-2 times, so as to make the first null indicator D1, the second null indicator D2, the third null indicator D3 and the fifth null indicator D5 all point to zero.

Embodiment 3

Figure 5:
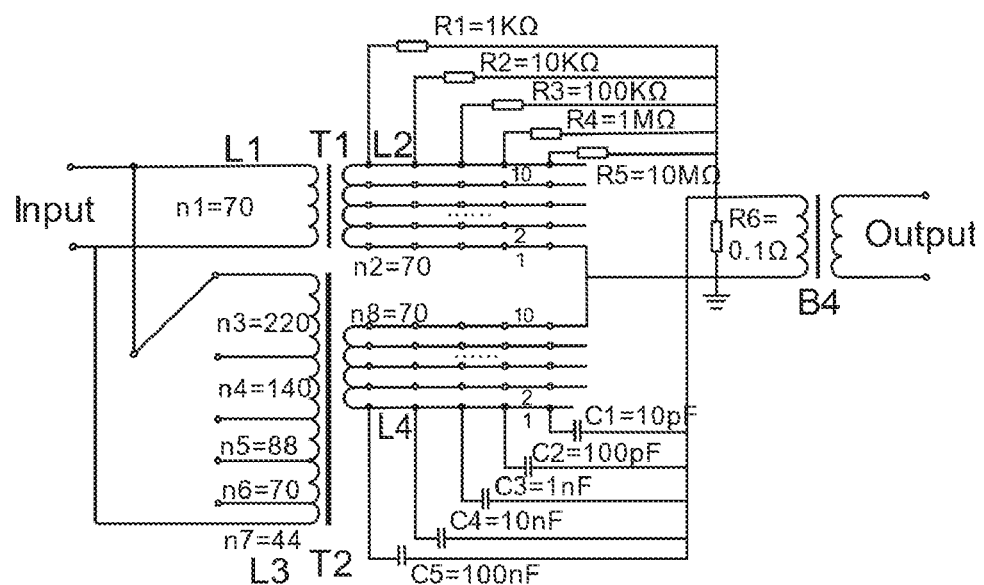
FIG. 5 is a schematic internal circuit diagram of an error injection/compensation network in the four-terminal-pair AC quantum resistance dissemination bridge according to an embodiment of the invention.

An internal structure of the injection inductive voltage divider A4 is shown in FIG. 5. Specifically, the injection inductive voltage divider A4 includes: a first inductive voltage divider T1, a second inductive voltage divider T2, a set of voltage-dividing resistors R (R1-R5) connected to a secondary winding L2 of the first inductive voltage divider T1, a set of voltage-dividing capacitors C (C1-C5) connected to a secondary winding L4 of the second inductive voltage divider T2, a resistor R6, and a compensation winding B4. Each of the secondary winding L2 of the first inductive voltage divider T1 and the secondary winding L4 of the second inductive voltage divider T2 is disposed with 10 taps, each of the taps is disposed with five connection points respectively allowing the voltage-dividing resistors R (R1-R5) or the voltage-dividing capacitors C (C1-C5) to be connected thereto. The voltage-dividing resistors R (R1-R5) and the voltage-dividing capacitors C (C1-C5) are selectively connected or unconnected to corresponding taps, to change a current flowing through the resistor R6 and thereby change an error injection voltage on a lead between the low-voltage end of the IVD2 and the second four-terminalpair AC resistor connection point Z2 injected through the compensation winding B4, so that the first balance network D1 points to zero and the error adjustment function is realized.

A primary winding L3 of the second inductive voltage divider T2 is an adjustable winding. The primary winding L3 of the second inductive voltage divider T2 is provided with multiple (i.e., more than one) taps as per a certain turn ratio, preferably is provided with six taps in FIG. 5, which sequentially are a first tap, a second tap, a third tap, a fourth tap, a fifth tap and a sixth tap from the high-end to low-end. The sixth tap is directly connected to the low-voltage end of the isolated inductive winding L0, and the high-voltage end of the isolated inductive winding L0 is selectively connected to the first tap, the second tap, the third tap, the fourth tap or the fifth tap as per a magnitude of a frequency. As a result, a four-terminal-pair AC quantum resistance dissemination bridge with multiple frequency points can be obtained without changing capacitances of the respective voltage-dividing capacitors C. Namely, the four-terminal-pair AC quantum resistance dissemination bridge with multiple frequency points can be achieved by employing one set of voltage-dividing capacitors C.

A primary winding L1 of the first inductive voltage divider T1, the secondary winding L2 of the first inductive voltage divider T1 and the secondary winding L4 of the second inductive voltage divider T2 have the same number of turns, namely 70 turns. Each of the secondary winding L2 of the first inductive voltage divider T1 and the secondary winding L4 of the second inductive voltage divider T2 is provide with 10 taps, the number of turns between every adjacent two of the taps is 7 turns, one end of each of the voltage-dividing resistors R1-R5 is serially connected to the resistor R6, and other ends of the voltage-dividing resistors R1-R5 each are selectively connected any one tap of the secondary winding L2 of the first inductive voltage divider T1. One end of each of the voltage-dividing capacitors C1-C5 is serially connected to the resistor R6, and other ends of the voltage-dividing capacitors C1-C5 each are selectively connected any one tap of the secondary winding L4. By connecting to different taps, a value of a current flowing through the resistor R6 can be changed, and thereby the error voltage on the lead between the low-voltage end of the ratio transformer IVD2 and the Z2 injected by L0 is changed, and the error adjustment function is realized consequently.

The resistors R1-R5 include the first resistor R1, the second resistor R2, the third resistor R3, the fourth resistor R4 and the fifth resistor R5; and resistances of R1, R2, R3, R4 and R5 respectively are 1 kΩ, 10 kΩ, 100 kΩ, 1 MΩ and 10 MΩ. The capacitors C1-C5 include the first capacitor C1, the second capacitor C2, the third capacitor C3, the fourth capacitor C4 and the fifth capacitor C5; and capacitances of C1, C2, C3, C4 and C5 respectively are 10 pF, 100 pF, 1 nF, 10 nF and 100 nF.

Preferably, a number of turns n1 of the first excitation winding L1, a number of turns n2 of the real part error inductive winding L2, and a number of turns n8 of the imaginary part error inductive winding L4 all are 70 turns. When the frequency is 1 kHz, the number of coil turns n7 between the fifth tap and the sixth tap is 44 turns; when the frequency is 1.592 kHz, the number of coil turns n6 between the fourth tap and the sixth tap is 70 turns; when the frequency is 2 kHz, the number of coil turns n5 between the third tap and the sixth tap is 88 turns; when the frequency is 3.184 kHz, and the number of coil turns n4 between the second and sixth taps is 140 turns; and when the frequency is 5 kHz, the number of coil turns n3 between the first tap and the sixth tap is 220 turns; so as to ensure that an impedance of the imaginary part error compensation capacitor set is unchanged. Namely, the four-terminal-pair AC quantum resistance dissemination bridge with multiple frequency points is obtained by not changing capacitances of the imaginary part error compensation capacitor set.

It should be noted that the above specific embodiments can enable those skilled in the art to understand the invention more comprehensively, but are not intended to limit the invention in any way. Therefore, although the present specification has described the invention in detail with reference to the drawings and the illustrative embodiments, it should be understood by those skilled in the art that the embodiments of the invention can be modified or equivalently replaced. In short, all technical solutions and their changes that do not depart from the spirit and scope of the invention should be included in the scope of protection of the invention.

What is claimed is:

1. A four-terminal-pair alternating current (AC) quantum resistance dissemination bridge, wherein a ratio transformer (IVD2) is a main proportional arm of the four-terminal-pair AC quantum resistance dissemination bridge, and a compensation voltage of an injection inductive voltage divider (A4) is configured to be compensatively added into a bridge circuit of the four-terminal-pair AC quantum resistance dissemination bridge; characterized in that:
   an isolated inductive winding (L0) of a small number of turns is wound on a winding of the ratio transformer (IVD2), and the isolated inductive winding (L0) is configured to supply an excitation current to a primary winding of the injection inductive voltage divider (A4) to thereby avoid mutual influence of various branches caused by a direct connection of the primary winding of the injection inductive voltage divider (A4) with a supply transformer (IVD1) and realize rapid balance of the bridge.

2. The four-terminal-pair AC quantum resistance dissemination bridge as claimed in claim 1, wherein an outer circumferential surface of the winding of the ratio transformer (IVD2) is independently wound with the isolated inductive winding (L0) of one turn.

3. The four-terminal-pair AC quantum resistance dissemination bridge as claimed in claim 1, comprising: the supply transformer (IVD1), a Kelvin branch (A1), a Wagner branch (A0), a first current source (A2), a second current source (A3), the injection inductive voltage divider (A4), the ratio transformer (IVD2), a first four-terminal-pair AC resistor connection point (Z1), a second four-terminal-pair AC resistor connection point (Z2), chokes H, and null indicators (D);
   wherein the Kelvin branch (A1) is configured to proportionally distribute lead resistances between the first four-terminal-pair AC resistor connection point (Z1) and the second four-terminal-pair AC resistor connection point (Z2) to thereby eliminate a lead error, the ratio transformer (IVD2) and the Wagner branch (A0) are connected in parallel between two ends of the supply transformer (IVD1) and configured to eliminate current leakage on a proportional balance point (V0) of the main proportional arm, and the injection inductive voltage divider (A4) is configured to be supplied with the excitation current through the isolated inductive winding (L0) and compensate the compensation voltage into the bridge circuit.

4. The four-terminal-pair AC quantum resistance dissemination bridge as claimed in claim 1, wherein the injection inductive voltage divider (A4) comprises a first inductive voltage divider (T1) and a second inductive voltage divider (T2), a secondary winding (L2) of the first inductive voltage divider (T1) together with a set of voltage-dividing resistors (R) are configured to realize adjustment of real part balance of the bridge, a secondary winding (L4) of the second inductive voltage divider (T2) together with a set of voltage-dividing capacitors (C) are configured to realize adjustment of imaginary part balance of the bridge, a primary winding (L3) of the second inductive voltage divider (T2) are provided with taps from a high-voltage end to a low-voltage end as per a certain turn change, and a turn ratio of the primary winding (L3) to the secondary winding (L4) of the second inductive voltage divider (T2) is adjustable to make an induction ratio change of the second inductive voltage divider (T2) offset an impedance change of the voltage-dividing capacitors caused by a change of a frequency and thereby make an impedance of the voltage-dividing capacitors (C) do not change with the change of the frequency.

5. The four terminal-pair AC quantum resistance dissemination bridge as claimed in claim 3, wherein the injection inductive voltage divider (A4) comprises a first inductive voltage divider (T1) and a second inductive voltage divider (T2), a secondary winding (L2) of the first inductive voltage divider (T1) together with a set of voltage-dividing resistors (R) are configured to realize adjustment of real part balance of the bridge, a secondary winding (L4) of the second inductive voltage divider (T2) together with a set of voltage-dividing capacitors (C) are configured to realize adjustment of imaginary part balance of the bridge, a primary winding (L3) of the second inductive voltage divider (T2) are provided with taps from a high-voltage end to a low-voltage end as per a certain turn change, and a turn ratio of the primary winding (L3) to the secondary winding (L4) of the second inductive voltage divider (T2) is adjustable to make an induction ratio change of the second inductive voltage divider (T2) offset an impedance change of the voltage-dividing capacitors caused by a change of a frequency and thereby make an impedance of the voltage-dividing capacitors (C) do not change with the change of the frequency.

6. The four-terminal-pair AC quantum resistance dissemination bridge as claimed in claim 4, wherein a primary winding (L1) of the first inductive voltage divider (T1), the secondary winding (L2) of the first inductive voltage divider (T1) and the secondary winding (L4) of the second inductive voltage divider (T2) all have the same number of turns, namely 70 turns; the primary winding (L3) of the second inductive voltage divider (T2) is connected to the tap with a number of turns being 44 turns when the frequency is 1 kHz, the primary winding (L3) of the second inductive voltage divider (T2) is connected to the tap with a number of turns being 70 turns when the frequency is 1.592 KHz, the primary winding (L3) of the second inductive voltage divider (T2) is connected to the tap with a number of turns being 88 turns when the frequency is 2 kHz, the primary winding (L3) of the second inductive voltage divider (T2) is connected to the tap with a number of turns being 140 turns when the frequency is 3.184 kHz, the primary winding (L3) of the second inductive voltage divider (T2) is connected to the tap with a number of turns being 220 turns when the frequency is 5 kHz, thereby ensuring the impedance of the voltage-dividing capacitors (C) does not change with the change of the frequency.

7. The four-terminal-pair AC quantum resistance dissemination bridge as claimed in claim 5, wherein a primary winding (L1) of the first inductive voltage divider (T1), the secondary winding (L2) of the first inductive voltage divider (T1) and the secondary winding (L4) of the second inductive voltage divider (T2) all have the same number of turns, namely 70 turns; the primary winding (L3) of the second inductive voltage divider (T2) is connected to the tap with a number of turns being 44 turns when the frequency is 1 kHz, the primary winding (L3) of the second inductive voltage divider (T2) is connected to the tap with a number of turns being 70 turns when the frequency is 1.592 KHz, the primary winding (L3) of the second inductive voltage divider (T2) is connected to the tap with a number of turns being 88 turns when the frequency is 2 kHz, the primary winding (L3) of the second inductive voltage divider (T2) is connected to the tap with a number of turns being 140 turns when the frequency is 3.184 kHz, the primary winding (L3) of the second inductive voltage divider (T2) is connected to the tap with a number of turns being 220 turns when the frequency is 5 kHz, thereby ensuring the impedance of the voltage-dividing capacitors (C) does not change with the change of the frequency.

8. The four-terminal-pair AC quantum resistance dissemination bridge as claimed in claim 3, wherein a signal generator (DDF1), a phase-locked amplifier (DDF2), and the supply transformer (IVD1) together constitute a power supply; a primary winding of the supply transformer (IVD1) is connected to the signal generator (DDF1) and the phase-locked amplifier (DDF2) through a power amplifier, and a secondary winding of the supply transformer (IVD1) has a first output terminal (V11), a second output terminal (V12), a third output terminal (V13) and a fourth output terminal (V14) from its high-voltage end to its low-voltage end sequentially; the second output terminal (V12) and the third output terminal (V13) are configured to supply power to the ratio transformer (IVD2) and the Wagner branch (A0) of the bridge, and a number of coil turns between the first output terminal (V11) and the second output terminal (V12) is equal to a number of coil turns between the third output terminal (V13) and the fourth input terminal (V14); the first output terminal (V11) and the second output terminal (V12) are configured to supply power to a high voltage proportional branch of the bridge where the first current source (A2) is located, the third output terminal (V13) and the fourth output terminal (V14) are configured to supply power to a low voltage proportional branch of the bridge where the second current source (A3) is located, and a polarity of a potential supplied to the high voltage proportional branch of the bridge is opposite to a polarity of a potential supplied to the low voltage proportional branch of the bridge.

9. A four-terminal-pair AC resistor measurement method, using the four-terminal-pair AC quantum resistance dissemination bridge as claimed in claim 3 to measure a to-be-measured four-terminal-pair AC resistor (Rx), and comprising:
step 1, select a standard four-terminal-pair AC resistor (Rs) according to measurement requirements after obtaining a nominal value of the to-be-measured four-terminal-pair AC resistor (Rx), connect the to-be-measured four-terminal-pair AC resistor (Rx) and the standard four-terminal-pair AC resistor pair AC resistor (Rs) to the first four-terminal-pair AC resistor connection point (Z1) and the second four-terminal-pair AC resistor connection point (Z2) respectively, and obtain the proportional balance point (V0) of a secondary winding of the ratio transformer (IVD2) corresponding to a turn ratio of winding of the ratio transformer (IVD2) according to a ratio between the nominal value of the to-be-measured four-terminal-pair AC resistor (Rx) and the nominal value of the standard four-terminal-pair AC resistor (Rs);

step 2, adjust the Wagner branch (A0) to make a potential on the proportional balance point (V0) of the ratio transformer (IVD2) be a ground potential and thereby make a fifth null indicator (D5) connected with the proportional balance point (V0) point to zero to solve current leakage on the proportional balance point (V0) of the secondary winding of the ratio transformer (IVD2) of the bridge;

step 3, adjust the first current source (A2) to make a second null indicator (D2) connected between a high-voltage end of the ratio transformer (IVD2) and the first four-terminal-pair AC resistor connection point (Z1) point to zero and thereby solve a problem of current existing in a high voltage proportional branch of the bridge;

step 4, adjust the second current source (A3) to make a third null indicator (D3) connected between a low-voltage end of the ratio transformer (IVD2) and the second four-terminal-pair AC resistor connection point (Z2) point to zero and thereby solve a problem of current existing in a low voltage proportional branch of the bridge;

step 5, supply power to the Kelvin branch (A1) through an inductive voltage supply winding (B0) and adjust Kelvin branch (A1) to make a first null indicator (D1) connected with the Kelven branch (A1) point to zero again and thereby solve a problem of equal-proportional distribution of lead resistances between the first four-terminal-pair AC resistor connection point (Z1) and the second four-terminal-pair AC resistor connection point (Z2);

step 6, disable the inductive voltage supply winding (B0) to supply power to the Kelvin branch (A1), adjust the injection inductive voltage divider (A4) again to make the first null indicator (D1) point to zero again, verifying that the second null indicator (D2), the third null indicator (D3) and the fifth zero pointer D5 null indicator (D5) all point to zero, and then read values of real part and imaginary part of the injection inductive voltage divider (A4) to thereby obtain a real part difference and an imaginary part difference between the to-be-measured four-terminal-pair AC resistor (Rx) and the standard four-terminal-pair AC resistor (Rs) and derive a real part quantity value and an imaginary part quantity value of the to-be-measured AC resistor (Rx); and step 7, adjust the injection inductive voltage divider (A4) to make the first null indicator (D1) connected with the Kelvin branch (A1) point to zero.

10. The four-terminal-pair AC resistor measurement method as claimed in claim 9, wherein one with a larger nominal value of the to-be-measured four-terminal-pair AC resistor (Rx) and the standard four-terminal-pair AC resistor (Rs) is connected to the first four-terminal-pair AC resistor connection point (Z1), the other one with a smaller nominal value of the to-be-measured four-terminal-pair AC resistor (Rx) and the standard four-terminal-pair AC resistor (Rs) is connected to the second four-terminal-pair AC resistor connection point (Z2), and the injection inductive voltage divider (A4) is supplied with an excitation current through the isolated inductive winding (L0) and compensates a compensation voltage into a bridge arm where the second four-terminal-pair AC resistor connection point (Z2), when a difference between the nominal value of the to-be-measured four-terminal-pair AC resistor (Rx) and the nominal value of the standard four-terminal-pair AC resistor (Rs) is at least one order of magnitude; or, wherein any one of the to-be-measured four-terminal-pair AC resistor (Rx) and the standard four-terminal-pair AC resistor (Rs) is selected to be connected to the first four-terminal-pair AC resistor connection point (Z1), when the difference between the nominal value of the to-be-measured four-terminal-pair AC resistor (Rx) and the nominal value of the standard four-terminal-pair AC resistor (Rs) is less than one order of magnitude.

11. The four-terminal-pair AC resistor measurement method as claimed in claim 9, wherein in the step 6, after adjusting the injection inductive voltage divider (A4) again to make the first null indicator (D1) point to zero again, checking the second null indicator (D2), the third null indicator (D3) and the fifth null indicator (D5) whether point to zero individually, and repeating the steps 2-7 for 1-2 times when any one of the second null indicator (D2), the third null indicator (D3) and the fifth null indicator (D5) does not point to zero to thereby make the second null indicator (D2), the third null indicator (D3) and the fifth null indicator (D5) all point to zero.

* * * * *